July 22, 1969 B. M. KERR 3,457,125

PASSIVATION OF SEMICONDUCTOR DEVICES

Filed June 21, 1966

INVENTOR
BRUCE M. KERR
BY Leo A. Plum, Jr.
ATTORNEY

United States Patent Office 3,457,125
Patented July 22, 1969

3,457,125

PASSIVATION OF SEMICONDUCTOR DEVICES

Bruce M. Kerr, Santa Clara, Calif., assignor to Union Carbide Corporation, a corporation of New York Filed June 21, 1966, Ser. No. 559,327
Int. Cl. H01l 7/48, 13/02
U.S. Cl. 148—187 18 Claims

ABSTRACT OF THE DISCLOSURE

A process for passivating a semiconductor device having one surface partially covered with an oxide layer by forming a first passivating dopant material of one conductivitity type covering the semiconductor body and the oxide layer, forming a second oxide layer covering the first passivating dopant material and forming a second passivating dopant material of the opposite conductivity type covering the second oxide layer.

This invention relates to processes for fabricating semiconductor devices, and more particularly to fabrication processes including the passivation of the surfaces of the semiconductor devices made, as well as to the provision of improved semiconductor devices.

The rapid development of procedures for fabricating semiconductor devices is well known. However, the successful utilization of such devices in complex and expensive equipments requires that they be extermely reliable and free of variations in electrical characteristics. Progress in regard to this aspect of semiconductor device production has not been as successful and there still results many failures of such devices due to such defects as high interconnection leakage currents.

Semiconductor devices contain regions of opposite conductivity types due to the presence of selected impurities within the body of semiconductive material forming the device. The proper operation of the device is dependent on the existence of the proper concentration and properly defined regions of such impurities. It is generally essential that no unwanted electrical paths exist between such regions and that no short circuiting take place between the various electrical connections to the device. These devices are extremely small and the resulting close spacing of the interconnection contact areas makes their isolation difficult.

Various means have been devised for protecting the surfaces of semiconductor devices to prevent the occurrence of such defects as outlined above. Such surface stabilization processes include the formation of adherent skins of titanium or aluminum oxide over the devices, or the coating of the devices with polymers. Such measures have had only limited effectiveness.

The planar approach to semiconductor device fabrication does provide excellent semiconductor devices because of its use of protective oxide films over surfaces of the device during fabrication and over the major exposed surfaces of the finished device itself. The planar process involves coating a semiconductor body, a silicon wafer, for example, with a layer of oxide, i.e., silicon dioxide, thermally grown over the surfaces of the body. Windows or openings are then etched through this oxide layer by first masking all exposed areas of the device other than the desired window areas, and then exposing the body to a suitable etchant to remove the exposed oxide. Phosphorus, boron and other dopant impurities are then diffused into the silicon body in the location of the window openings using suitable compounds of these dopant materials, thereby forming the desired regions of differing conductivity. A silicon dioxide insulating coating is left on the finished devices protecting the rectifying junctions between the regions of opposite conductivity and covering the surface of the device between electrode contacting areas.

Despite the excellent protection afforded by the insulating silicon dioxide coating, it has been found that additional protection is often necessary. Impurities in the silicon body, near its surface, as well as impurities in and over the silicon dioxide coating can and do cause variations in electrical characteristics of such devices due to the formation of leakage paths when subjected, for example, to thermal and potential stress, or upon exposure to moisture.

Additional techniques for stabilizing such devices have been developed including, for example, the use of gettering materials to stabilize or tie-up the impurities. The getter material is often a dopant material and its introduction into the semiconductor device could cause changes in the conductivity pattern therein. Additionally the use of such getters often involves treating the semiconductor devices at high temperatures which can cause additional and unwanted further diffusion of dopants already dispersed inside the semiconductor device. It is a fact that there is still a need for an improved technique for stabilizing or passivating semiconductor devices.

It is the primary object of this invention therefore to provide an improved means for passivating the surfaces of semiconductor devices.

It is also an object of this invention to provide an improved process for passivating the surfaces of semiconductor devices, which process is compatible with existing techniques for fabricating such devices.

It is also an object of this invention to provide improved methods for fabricating semiconductor devices which methods include the steps of passivating the surfaces of the devices.

It is another object of this invention to provide semiconductive devices having highly passivated surfaces and which are capable of reliable operation under varying conditions with full achievement of their intended performance characteristics. These and other advantages of this invention will be apparent from the following description, the appended claims and the attached drawings.

In accordance with these objects a process is provided for passivating the surface of a semiconductor device comprising providing a wafer of semiconductor material having at least one surface at least partially covered with an oxide layer to be passivated, forming over said surface a first film of a passivating or stabilizing material, for example, a dopant material such as phosphorus; forming over the first film a second film of another passivating material, preferably a dopant material giving an opposite conductivity type in the semiconductive material, for example, a P-type acceptor impurity such as boron since N-type phosphorus is present in the first film; and then heating the so coated semiconductor body to passivate the surface thereof.

In a preferred form of the invention, particularly useful where regions of opposite conductivity types are to be formed in the same surface of the semiconductor device, the method comprises providing a semiconductor device having at least one surface to be passivated, said surface at least partially coated with an oxide layer, forming over said surface a film of a passivating material, such as a P or N type dopant, for example, the N-type dopant phosphorus; forming a new film of oxide over the phosphorus film coated surface; and forming over the new or outermost film of oxide a second film of a passivating material, for example, a dopant material giving an opposite conductivity type in the semiconductor body compared to the dopant material in the first film, such as, for example, boron in the second film since phosphorus is present in the first film; and heating the semiconductive body with its layers of films to diffuse dopant material from the first film into selected openings in the original oxide coating on the semiconductor body and to passivate the surface of said semiconductor body.

These and other aspects of this invention will be best understood by reference to the attached drawings, wherein.

Figure 1:
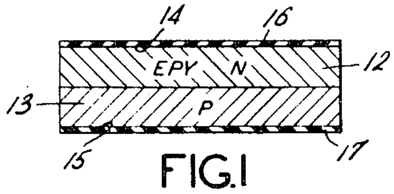
FIGS. 1 through 7 are schematic sectional views on an exaggerated scale of a transistor structure in various stages of fabrication according to the processes of this invention.

FIG. 1 shows a semiconductor unit 11 or portion of a semiconductor wafer having an epitaxial layer 12 superimposed on a substrate silicon crystal 13. The figure is exaggerated for the purpose of illustration and the epitaxial layer in actuality is much thinner than indicated. This body 11 is to be fabricated into a field effect transistor as an example of the process of this invention. It is to be understood however that the invention is not limited to the production of this specific device but rather is applicable to the production of all forms of semiconductor devices having surfaces needing passivation.

As shown, the semiconductor body 11 has a silicon substrate 13 of P type silicon, i.e., silicon having dispersed therein acceptor type impurities, for example boron. The epitaxial layer 12 superimposed on the P type substrate is itself N type silicon grown by methods known in the art involving the incorporation of N type or donor impurities, such as phosphorus, in the epitaxial silicon. A portion of this N type epitaxial layer, which is in practice only lightly doped with N type impurities, is to form the buried channel region of an N type channel field effect transistor.

The body 11 has a top surface 14 and a bottom surface 15. Both surfaces are shown covered by layers 16 and 17 of oxide formed in a known manner as by heating the silicon body 11 in oxygen, water or other oxidizing atmospheres.

Figure 2:
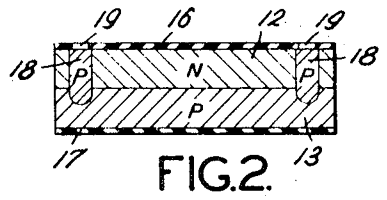
Figure 8:
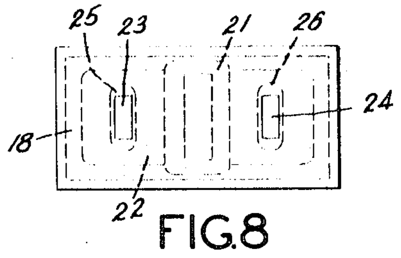
FIG. 8 is a schematic plan view on an exaggerated scale of the transistor structure shown in FIGS. 1 through 7.

An isolation barrier 18 may be formed at this time, if desired, extending completely around all sides of a central zone in which the components of the field effect transistor are located to electrically isolate such zone, as from other zones in the same body of semiconductor material. This barrier is formed of a material of opposite polarity to the polarity of the channel; and in this case the barrier is formed of P type material. The barrier is formed by using known steps including the formation of openings 19 in the oxide coating 16. This opening runs completely around the central zone of the body, generally in a rectangular form, and is shown in cross section with only the side portions of the opening 19 visible. The remainder of the oxide layer 16 thus forms a mask allowing access to the underlying silicon only in the exposed areas beneath the openings 19. The barrier 18 can then be formed by diffusing a P type barrier purity through the openings 19. The oxide layer 16 or mask protects the remainder of the surfaces of the semiconductor body. FIGS. 2 and 8 show this P type diffused barrier which was formed by diffusing boron into the body, using for example a boron trichloride diffusant. The barrier 18 is shown extending only into the substrate area 13 in this case, but may extend completely through the body in other cases. It is only necessary here that the isolation diffusion make contact with the substrate 13 which forms the lower gate region in the field effect transistor illustrated.

Figure 3:
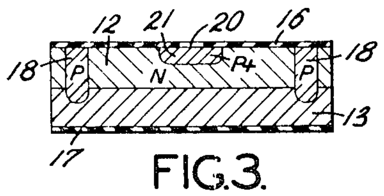

Referring now to FIG. 3, the oxide layer 16 is shown regrown over the opening 19 and a new opening 20 is now formed as by etching, to produce a mask for diffusing an upper gate region 21 extending over and defining the upper geometry of a channel 22. This upper gate region is to be of the same polarity as the substrate or main gate region 13, i.e., P type, but more heavily doped to form a region designated P+. The P type impurity, e.g. boron, is diffused through the opening 20 to form the P+ upper gate region 21. As shown in the plan view of FIG. 8. This upper gate region 21 may extend over channel 22 into the barrier diffusion 18 so as to make electrical contact with the main gate region 13.

Figure 4:
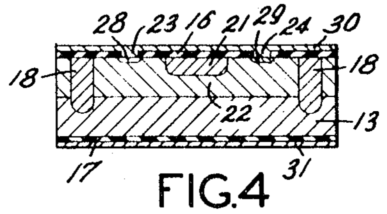

As seen in FIG. 4 the oxide layer 16 is regrown over the opening 20 and holes 23 and 24 are formed in this oxide layer. According to the conventional practice, source 25 and drain 26 regions as shown in FIG. 8 would now be diffused into the body 11 through the openings 23 and 24. These source and drain regions are spaced apart on either side of the channel region 22 and form the source and drain electrodes to which ohmic contacts are later made. The source and drain regions are of the same conductivity type as the channel, in this case N type, and may be formed by diffusion using extra impurities to form more heavily doped N+ regions for better ohmic contacting.

According to the preferred process of this invention, however, the source and drain regions are not completely diffused at this time, but rather the following procedure is followed: donor impurities are predeposited through the holes 23 and 24 onto the surface of the exposed silicon body without appreciable diffusion, while at the same time the entire surface of the semiconductor body, top and bottom, and including the oxide layers 16 and 17 are also covered with a thin film of the same dopant material, as shown schematically and with great exaggeration in FIG. 4. This dopant material diffuses only slightly into the exposed areas at the holes 23 and 24 as suggested by the shallow regions thereunder designated 28 and 29. The dopant material deposited is an N type material such as phosphorus formed by contacting the heated body with a stream of phosphorus trichloride. A film 30 of phosphorus is shown covering the upper surface of the semiconductor body while a film designated 31 is shown covering the bottom surface of the body.

Figure 5:
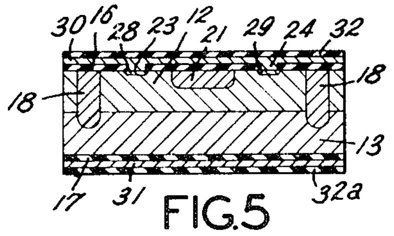

Following this predeposition of N type dopant material and the formation of the films 30 and 31, a new layer of oxide is grown over the films 30 and 31 by a low temperature oxidation conducted at about 900° C., as further set forth hereinafter. An oxide film 32 is now formed over the phosphorus film 30 covering the upper surface of the semiconductor body and an oxide layer designated 32*a* covers the phosphorus film 31 covered lower surface of the body, as shown in FIG. 5.

The function of the oxide layer 32 over the top surface is to provide a mask for the next processing step which involves the formation of a second film of passivating material, in this case an acceptor impurity material such as boron. If a boron film was formed directly over the phosphorus film 30 on the top surface, the P type boron would contaminate the N type phosphorus dopant material predeposited under the holes 23 and 24 for later diffusion to produce source and drain electrodes 25 and 26 as shown in FIG. 8. The regrown oxide layer over the first film is preferably formed to a thickness of about 1000 A.

The second film of passivating material, in this case boron, is deposited over the oxide layer 32 by exposing the body to a stream of a boron compound such as boron tribromide. A film 33 is thus deposited over the whole of the top surface of the semiconductor body. This exposure to the boron halide will also form a film of boron over the lower surface of the body, but since, in the case of the embodiment being illustrated here, there are no exposed regions on the bottom surface to be protected from the boron dopant, the oxide film 32*a* (covering the phosphorus film 31 on the lower surface) is first removed using known techniques to bare the phosphorus film 31. The exposure to the boron halide will then coat this phosphorus film 31 directly with a boron film 34, whereas at the top surface the boron film 33 was separated from the phosphorus film 30 and the underlying exposed silicon surfaces at holes 23 and 24 by the oxide film 32, as shown in FIG. 6.

Figure 6:
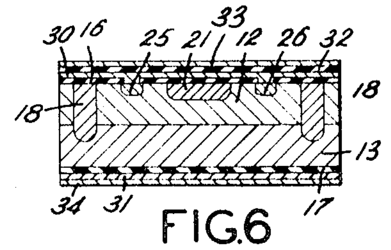

The assembly shown in FIG. 6 is then heated to a high temperature to complete the diffusion of the regions, previously shown as shallow diffusions 28 and 29, into the desired source and drain regions 25 and 26 as well as to accomplish the passivating of the surfaces of the semiconductor body by the phosphorus and boron films. This heating process involves raising the body to a temperature of about 1100° C. and holding there for about 20 minutes in a nitrogen atmosphere followed by a cooling period of about one hour in which the temperature of the body is lowered to about 850° C. and the body is then held there for about 2 hours. In practice the last deposition of film material is done with the body of semiconductor material at a temperature of about 1000° C. The body is then raised in temperature to 1100° C. and the final heating process initiated. As shown in FIG. 6 the N+ type regions 25 and 26 are now fully diffused and the films 30 and 33 on the top surface and the films 31 and 34 on the bottom surface have passivated the underlying oxide layers 16 and 17 directly on the surface of the semiconductor body, as well as the intermediate oxide layer 32 on the top surface.

Figure 7:
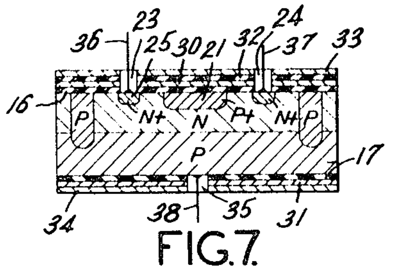

The semiconductor body is now ready for the formation of ohmic contacts at the source and drain electrodes, as well as at a gate region, in this case on the bottom surface, as shown in FIG. 7. Holes 23 and 24 are reformed in the boron film layer 33, oxide layer 32, and phosphorus film 30 at the source and drain regions on the top surface. At the bottom surface another hole 35 is formed in the boron film 34, phosphorus film 31 and original oxide layer 17. Contacting metals are deposited as by evaporation on the silicon exposed under the holes 23, 24 and 35 and alloyed into the silicon there, and then lead wires 36, 37 and 38 are attached to the source, drain and gate areas, as by thermocompression bonding. Thin film metallic contacts could also be made to these regions through the holes 23, 24 and 35, if desired.

It is important to note that the passivating materials are deposited at relatively low temperatures, for example by exposing the semiconductor body at a temperature of about 1000° C. to phosphorus trichloride or boron tribromide. At these temperatures there is little diffusion of the passivating material from the first layer into the exposed silicon surfaces. Complete diffusion of the source and drain regions in the example given previously does not occur until the final heating process. Similarly, the oxide layer which is grown over the first layer of passivating material is formed at a relatively low temperature, for example about 900° C., so that little diffusion takes place at that time. The reason for these low temperature passivating material predeposition and oxide growth steps is that higher processing temperatures would cause excessive lateral diffusions of dopant impurities in all areas of the device, seriously changing the intended geometry of the device and limiting its potential electrical performance characteristics. The diffusions of the source and drain regions are thus done during the final heating process which involves high enough temperatures to complete the diffusions. Additionally, it is expected that all diffusions done previous to the deposition of the films of passivating materials will be adjusted to allow for the fact that the high temperatures of the final heating step will cause additional lateral diffusion of these regions. Therefore the gate and barrier ring diffusions should not be completed in the early stages of the device fabrication, but rather they should only be partially diffused at those times with full diffusion to be completed in the final heating process.

It has been determined that the films of passivating materials should be deposited so as to contain only certain amounts or contents of dopant. Excessive deposition of dopant material in the first film could cause too heavy a diffusion into exposed areas of the silicon body underneath. Too little dopant material in the first film could result in diffused regions having too light a doping for good ohmic contacting. The following relationships have been found to express the proper amounts of dopant materials to be included in these films. These relationships express the sheet resistivity of phosphorus and boron films, formed according to this invention, and are indicative of a proper amount of dopant material in the films:

For N channel devices—
- Phosphorus $V/_I<1.0$ ohm cm.
- Boron $V/_I>1.0<10.0$ ohm cm.

For P channel devices—
- Boron $V/_I<1.0$ ohm cm.
- Phosphorus $V/_I<1.0$ ohm cm.

The resistivities $V/_I$ of the films are to be determined using the four point probe method discussed in the following article: "Measurement of Sheet Resistivity With the Four Point Probe" by F. M. Smits in the Bell System Technical Journal, May 1958, page 711.

It is readily understood to those skilled in the art that P channel devices can be made using the methods of this invention by reversing the order of deposition of dopant or passivating films.

The passivation of the surfaces of semiconductor devices accomplished by this invention is a significant improvement in the art. Leakage currents between interconnections are reduced 10 times lower using the process of this invention compared to the best prior art processes known. The passivation is accomplished, it is believed, by recombinations between the passivating materials in the films with impurities in the oxide layers as well as over and under such layers. It is to be understood that while for the purposes of illustration the films are described here as distinct metallic films, they are to some extent glassy films of phosphorus and boron compounds. However they do exist in the finished device.

The passivating materials preferred are phosphorus and boron, used according to the need for performing diffusion steps as well as passivating the surfaces of the device. These dopants may be deposited using the halide compounds given in the example, or by means of any other suitable compounds. Other suitable passivating materials may also be used according to the methods of this invention if desired, particularly the other known donor and acceptor dopants.

It is also within the scope of this invention to use the passivating films and oxide layers to fabricate various other types of devices. For example impurities from both passivating films may be used to form diffused surface regions in a semiconductor device while at the same time passivating the surfaces of the device.

Figure 9:
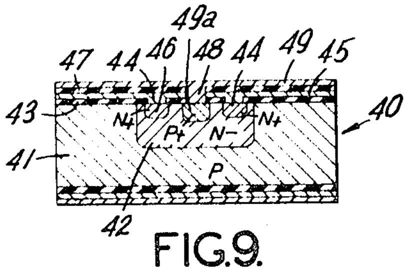
FIG. 9 is a schematic sectional view of another transistor structure made according to the methods of this invention in an intermediate stage of fabrication, also at a greatly exaggerated scale.

FIG. 9 shows a bilateral transistor device in a partial stage of fabrication according to processes of this invention. The device comprises a body 40 of semiconductor material of P type impurity, which forms the collector region 41 of the device. A base region 42 of lightly doped N-type impurity has already been diffused into the upper surface. The original oxide layer 43 covering the upper surface of the body is provided with an annular opening 44 to provide access to the base region. A phosphorus film 45 has been deposited over the surface of this oxide layer 43. The phosphorus is thus deposited under the opening 44 and will, on later heating to a diffusion temperature, form heavily doped annular N+ region 46, needed for good ohmic contact to the N-base region. An oxide layer 47 is then grown over the phosphorus film 45. An opening 48 is now formed in the new oxide layer 47 so as to allow access to the semiconductor body underneath.

It is also necessary to form this opening through the underlying phosphorus film 45 and original oxide 43. A boron film 49 is then deposited over the new oxide layer 47 thereby contacting the silicon body underneath the opening 48 with boron, or P type diffusant. When the semiconductor body is heated, the boron diffusant will form the P+ emitter region 49*a* and phosphorus diffusant from the film 45 will form the N+ base contacting ring 46.

Figure 10:
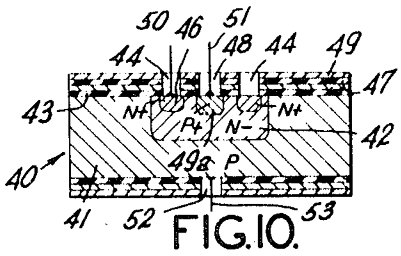
FIG. 10 is a schematic sectional view of the finished transistor structure of FIG. 9.

The ring shaped opening 44 is reformed and lead 50 is connected thereto. The opening 48 is reformed and lead 51 connected thereto. Another opening 52 is formed in the films on the underside of the device and lead 53 to the collector is made there, as shown in FIG. 10.

It should be understood that the process of this invention provides a valuable means for fabricating all forms of semiconductor devices as well as for passivating the surfaces thereof. While the invention has been described only in regard to the production of the devices described herein, it is understood that all other possible devices and variations of the process steps needed to make such devices are included within the scope of this invention.

What is claimed is:

1. A process for passivating a semiconductor device comprising providing a body of semiconductive material having at least one surface covered with an oxide layer with no openings therein, forming over said surface a first film of a passivating dopant material, forming over the first film a second film of a passivating dopant material giving an opposite conductivity type than the dopant in the first film, and heating the so coated semiconductor body to passivate the surface thereof.

2. The process as set forth in claim 1 in which the semiconductor materal is silicon semiconductive material.

3. The process as set forth in claim 2 in which the dopant in the fisrt film is selected from the group consisting of phosphorus and boron, and in which the dopant in the second film is the dopant not selected for the first film.

4. A process for passivating a semiconductor device comprising providing a silicon semiconductor body having at least one surface at least partially covered with an oxide layer, forming over said surface a first film of a passivating dopant material, forming over said first film a new layer of oxide, forming over said new oxide layer a second film of passivating dopant material giving an opposite conductivity type than the dopant in the first film, and heating the so coated semiconductor body to passimate the surface thereof.

5. The process as set forth in claim 4 in which the dopant in the first film is selected from the group consisting of phosphorus and boron, and in which the dopant in the second film is the dopant not selected for the first film.

6. A process for fabricating a semiconductor device comprising providing a silicon semiconductor body having at least one surface covered with an oxide layer, said oxide layer having selected openings therein over areas of the silicon body to be further diffused, forming over said surface a first film of a passivating dopant material, forming over said first film a new oxide layer, forming over said new oxide layer a second film of passivating dopant material giving an opposite conductivity type than the dopant in the first film, and heating the so coated body to diffuse dopant impurities from the first film through the openings in the original oxide layer into the selected areas of the silicon body to create doped regions therein, said heating also causing passivation of said oxide layers.

7. The process as set forth in claim 6 in which the dopant in the first film is selected from the group consisting of phosphorus and boron, and in which the dopant in the second film is the dopant not selected for the first film.

8. The process as set forth in claim 7 in which the films of dopant and the new oxide layer therebetween are formed at temperatures at which appreciable diffusion does not occur.

9. The process as set forth in claim 8 in which the temperatures of deposition and oxide layer regrowth are not higher than about 1000° C.

10. The process as set forth in claim 9 in which the final heating of the coated device comprises a heating of the body to about 1100° C. for about 20 minutes following by a cooling to about 850° C. in about a one hour period, and then holding the body at about 850° C. for about 2 hours.

11. The process as set forth in claim 10 in which there are surfaces on said silicon body having oxide coatings with no openings and in which the new oxide layer grown over the first film is removed prior to the deposition of the second film so that the first and second films are in contact.

12. The process as set forth in claim 10 in which openings are made at selected areas in the new layer of oxide as well as the underlying regions of first film and original oxide layer, whereby on deposition of the second film of dopant material and final heating of the so coated body, diffusion of dopant material from the second film into the silicon body takes place creating additional doped regions in said body.

13. A process for fabricating a semiconductor device comprising a silicon semiconductor body having its upper and lower surfaces coated with a layer of oxide, at least one of said oxide layers having openings therein at selected areas for the diffusion of dopant materials therethrough to create doped regions in said silicon body, forming over said surfaces first films of a dopant material selected from the group consisting of phosphorus and boron by deposition at a temperature no higher than about 1000° C., forming new layers of oxide over the first films by oxidation at a temperature of about 900° C., forming over said oxide layers second films of the dopant material not selected in the first films by deposition at a temperature no higher than about 1000° C. and thereafter raising the temperature of the body to about 1100° C. and holding there for about 20 minutes, followed by cooling of the body to about 850° C. over a one hour period, and holding at about 850° C. for about 2 additional hours.

14. The process as set forth in claim 13 in which there is a surface of the semiconductor body having an oxide layer with no openings for the later diffusion of dopant impurities, and in which the new oxide layer grown over the first film formed on said surface is removed prior to the deposition of the second film of dopant material.

15. The process as set forth in claim 13 in which openings are formed in the new oxide layers as well as the underlying first film and original oxide layer prior to the deposition of the second film whereby diffusion of dopant impurities from the first film can take place through said openings upon later heating of the so coated body to diffusion temperatures.

16. The process as set forth in claim 14 in which a field effect transistor is produced by providing a semiconductor body composed of a substrate of one conductivity type having superimposed thereon an epitaxial layer of an opposite conductivity type, and wherein an upper gate region of the same conductivity type as the substrate is diffused into the upper surface of said epitaxial layer, said upper gate region tied by diffused regions to the substrate, and in which the body is then coated with oxide layers on the upper and lower surfaces thereoff, said oxide layer on the upper surface having openings therein on either side of the underlying upper gate region, and in which the first films, new oxide layer and second films of dopant materials are then deposited with dopant material from the first film diffusing through the openings in the oxide layer to form the source and drain electrodes, the dopant material in the first film being of the same conductivity type as the epitaxial layer.

17. The process as set forth in claim 15 in which a bilateral transistor is produced comprising providing a semiconductor body of a selected conductivity type, diffusing a lightly doped base region of the opposite conductivity into the upper surface of the body, providing the body with oxide layers over its upper and lower surfaces, said oxide layer on the upper surface having at least one opening therein over the base region for the diffusion of a heavily doped base contact region, and then forming the first film of dopant material selecting a dopant of the same conductivity as the base region, forming a new oxide layer over the first film, said oxide layer having an opening therein over the base region for the diffusion of an emitter region therein, and depositing the second film over the new oxide layer, said second film comprising the dopant material for forming the emitter region by diffusion into the base region.

18. The process as set forth in claim 16 in which the first and second films are deposited with resistivities, as measured by the four point probe method, in the following relationships for N channel field effect transistors:

$V/_I$ for phorphorus film <1 ohm cm.

$V/_I$ for boron film >1<10 ohm cm.

and in the following relationships for P channel field effect transistors:

$V/_I$ for boron film <1 ohm cm.

$V/_I$ for phosphorus film <1 ohm cm.

References Cited

UNITED STATES PATENTS

| | | | |
|---|---|---|---|
| 3,206,827 | 9/1965 | Kriegsman | 29—578 X |
| 3,226,611 | 12/1965 | Haenichen. | |
| 3,275,910 | 9/1966 | Phillips. | |
| 3,350,222 | 10/1967 | Ames. | |

L. DEWAYNE RUTLEDGE, Primary Examiner

R. A. LESTER, Assistant Examiner

U.S. Cl. X.R.

29—571, 576, 578; 117—201, 215; 148—188, 189; 317—235